(12) United States Patent
Pellizzer et al.

(10) Patent No.: US 11,031,553 B2
(45) Date of Patent: Jun. 8, 2021

(54) METHOD, SYSTEM, AND DEVICE FOR PHASE CHANGE MEMORY SWITCH WALL CELL WITH APPROXIMATELY HORIZONTAL ELECTRODE CONTACT CROSS REFERENCES

(71) Applicant: Ovonyx Memory Technology, LLC, Alexandria, VA (US)

(72) Inventors: Fabio Pellizzer, Comate D'Adda (IT); Innocenzo Tortorelli, Moncalieri (IT)

(73) Assignee: OVONYX MEMORY TECHNOLOGY, LLC, Alexandria, VA (US)

(*) Notice: Subject to any disclaimer, the term of this patent is extended or adjusted under 35 U.S.C. 154(b) by 0 days.

(21) Appl. No.: 16/776,391

(22) Filed: Jan. 29, 2020

(65) Prior Publication Data
US 2020/0243765 A1     Jul. 30, 2020

Related U.S. Application Data

(60) Division of application No. 16/216,161, filed on Dec. 11, 2018, now Pat. No. 10,580,980, which is a continuation of application No. 15/876,886, filed on Jan. 22, 2018, now Pat. No. 10,186,659, which is a continuation of application No. 15/596,798, filed on May 16, 2017, now Pat. No. 9,876,168, which is a
(Continued)

(51) Int. Cl.
*G11C 11/00*     (2006.01)
*H01L 45/00*     (2006.01)
*G11C 13/00*     (2006.01)
*H01L 27/24*     (2006.01)

(52) U.S. Cl.
CPC ........ *H01L 45/1253* (2013.01); *G11C 13/003* (2013.01); *G11C 13/0004* (2013.01); *H01L 27/2409* (2013.01); *H01L 27/2463* (2013.01); *H01L 45/06* (2013.01); *H01L 45/1233* (2013.01); *H01L 45/141* (2013.01)

(58) Field of Classification Search
CPC .................................................... G11C 11/00
USPC ... 365/46, 94, 100, 113, 129, 148, 158, 163; 257/2–5, 9, 296, 310, E21.35, E31.047, 257/E27.006; 438/29, 95, 96, 166, 135, 438/240, 259, 365, 482, 486, 597, 785; 977/754
See application file for complete search history.

(56) References Cited

U.S. PATENT DOCUMENTS 7,265,050 B2     9/2007   Choi et al.
7,466,584 B1    12/2008   Parkinson et al.
(Continued)

OTHER PUBLICATIONS

Proceedings of the IEEE—Phase Change Memory—27 pages Dec. 12, 2010.

*Primary Examiner* — Harry W Byrne
(74) *Attorney, Agent, or Firm* — Holland & Hart LLP

(57) ABSTRACT

Embodiments disclosed herein may include depositing a storage component material over and/or in a trench in a dielectric material, including depositing the storage component material on approximately vertical walls of the trench and a bottom of the trench. Embodiments may also include etching the storage component material so that at least a portion of the storage component material remains on the approximately vertical walls and the bottom of the trench, wherein the trench is contacting an electrode and a selector such that storage component material on the bottom of the trench contacts the electrode.

20 Claims, 9 Drawing Sheets

Related U.S. Application Data continuation of application No. 15/339,603, filed on Oct. 31, 2016, now Pat. No. 9,698,345, which is a continuation of application No. 14/642,484, filed on Mar. 9, 2015, now Pat. No. 9,520,555, which is a continuation of application No. 14/094,532, filed on Dec. 2, 2013, now Pat. No. 8,976,570, which is a division of application No. 13/224,281, filed on Sep. 1, 2011, now Pat. No. 8,599,599.

(56) References Cited

U.S. PATENT DOCUMENTS

| | | |
|---|---|---|
| 7,569,845 B2 | 8/2009 | Chen et al. |
| 7,655,938 B2 | 2/2010 | Kuo et al. |
| 7,800,933 B2 | 9/2010 | Kumar et al. |
| 7,876,605 B2 | 1/2011 | Haring-Bolivar et al. |
| 8,377,741 B2 | 2/2013 | Savransky et al. |
| 8,569,734 B2 | 10/2013 | Redaelli et al. |
| 2002/0192901 A1* | 12/2002 | Kimura ............ H01L 27/11502 438/253 |
| 2003/0141541 A1* | 7/2003 | Wu .................. H01L 29/40114 257/319 |
| 2003/0178675 A1* | 9/2003 | Nishizaka ............ H01L 27/105 257/340 |
| 2005/0023656 A1* | 2/2005 | Leedy ................ B81C 1/00238 257/678 |
| 2005/0024933 A1* | 2/2005 | Pellizzer ............ H01L 27/2445 365/163 |
| 2005/0127347 A1* | 6/2005 | Choi ................ H01L 21/76816 257/2 |
| 2010/0078619 A1* | 4/2010 | Redaelli .................. H01L 27/24 257/3 |
| 2010/0176365 A1 | 7/2010 | Park et al. |
| 2010/0232200 A1* | 9/2010 | Shepard ............. G11C 13/0023 365/51 |
| 2012/0032136 A1* | 2/2012 | Redaelli ............. H01L 27/2445 257/5 |
| 2013/0058158 A1 | 3/2013 | Pellizzer et al. |

* cited by examiner

400

METHOD, SYSTEM, AND DEVICE FOR PHASE CHANGE MEMORY SWITCH WALL CELL WITH APPROXIMATELY HORIZONTAL ELECTRODE CONTACT CROSS REFERENCES

CROSS-REFERENCES

This application is a divisional of U.S. patent application Ser. No. 16/216,161 by Pellizzer et al., entitled "Method, System, and Device for Phase Change Memory Switch Wall Cell with Approximately Horizontal Electrode Contact Cross References," filed Dec. 11, 2018, which is a continuation of U.S. patent application Ser. No. 15/876,886 by Pellizzer et al., entitled "Method, System, and Device for Phase Change Memory Switch Wall Cell with Approximately Horizontal Electrode Contact Cross References," filed Jan. 22, 2018, which is a continuation of U.S. patent application Ser. No. 15/596,798 by Pellizzer et al., entitled "Method, System, and Device for Phase Change Memory Switch Wall Cell with Approximately Horizontal Electrode Contact Cross References," filed May 16, 2017, which is a continuation of U.S. patent application Ser. No. 15/339,603 by Pellizzer et al., entitled "Method, System, and Device for Phase Change Memory Switch Wall Cell with Approximately Horizontal Electrode Contact Cross References," filed Oct. 31, 2016, which is a continuation of U.S. patent application Ser. No. 14/642,484 by Pellizzer et al., entitled "Method, System, and Device for Phase Change Memory Switch Wall Cell with Approximately Horizontal Electrode Contact," filed Mar. 9, 2015, which is a continuation of U.S. patent application Ser. No. 14/094,532 by Pellizzer et al., entitled "Method, System, and Device for Phase Change Memory Switch Wall Cell with Approximately Horizontal Electrode Contact," filed Dec. 2, 2013, which is a divisional of U.S. patent application Ser. No. 13/224,281 by Pellizzer et al., entitled "Method, System, and Device for Phase Change Memory Switch Wall Cell with Approximately Horizontal Electrode Contact," filed Sep. 1, 2011, assigned to the assignee hereof, and each of which is expressly incorporated by reference in its entirety herein.

BACKGROUND

Field

Subject matter disclosed herein may relate to integrated circuit devices, and may relate, more particularly, to circuitry related to a memory array.

Information

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering a memory device's suitability for any particular application may include, physical size, storage density, operating voltages, granularity of read/write operations, throughput, transmission rate, and/or power consumption, for example. Other example factors that may be of interest to system designers include cost of manufacture, and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
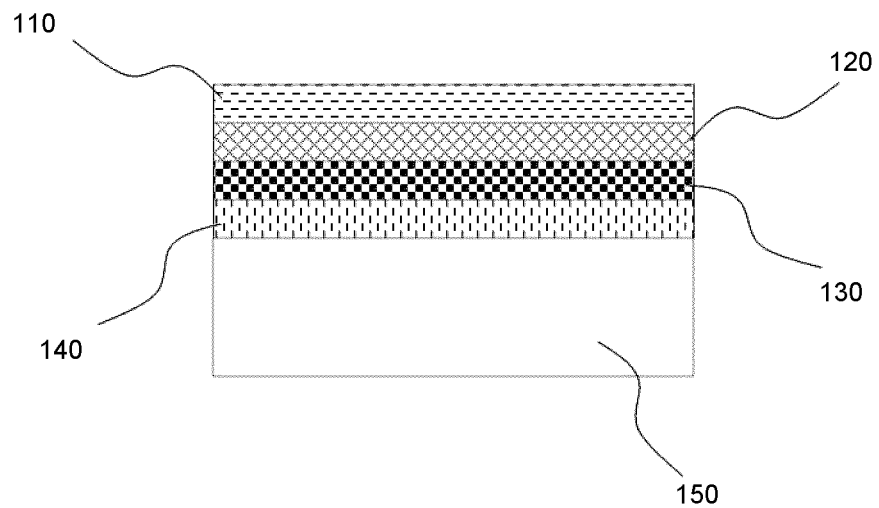
FIG. 1 is an illustration depicting a cross-sectional view of a phase change memory with a selector (PCMS) device, according to an embodiment.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, dimensions of some elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering a memory device's suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part determine at least some of the factors, such as those mentioned above, including storage density, physical size, and/or cost/ease of manufacture, for example.

An example process for forming one or more storage cells in a phase change with selector (PCMS) memory array may comprise depositing storage component material over and/or on one or more trenches in a dielectric material to decrease die size. One or more trenches may be formed in an area above a plurality of rows individually comprising an electrode and a selector such that bottom portions a storage component may contact an electrode positioned between a storage component and a selector, in an implementation. An example process may further comprise forming a trench in a material of the memory array to affect a size of the storage components at least in part through a lithographic operation utilizing a reduced pitch mask.

In an example embodiment, individual storage components may comprise an "L" shape, wherein an approximately vertical portion of an "L" shape comprises an aspect ratio at least partially affected by a thickness of a deposition of storage component material on an approximately vertical wall of a trench in one dimension and by an additional trench formed in an approximately orthogonal direction using a reduced pitch photolithographic mask in another dimension. A reduced aspect ratio, for example, may allow for a reduction in programming current. Also in an example embodiment, a horizontal portion of the "L" shaped storage component, hereafter called lower leg of an "L" shape, for an individual storage component may contact an electrode positioned between a storage component and a selector. A lower leg of an "L" shaped storage component may provide increased contact area with an electrode, providing an improved electrical connection with reduced resistance and further help increase yield during manufacturing. In one or more example embodiments, an increased contact area between a storage component and an electrode may be provided while still providing a reduced aspect ratio storage component. In this manner, reduced programming current may be achieved and improved manufacturing yield may also be achieved. However, claimed subject matter is not limited in scope in these respects.

FIG. 1 is an illustration depicting a cross-sectional view of an example embodiment 100 of a memory array. In an embodiment, memory array 100 may comprise a phase change memory switch (PCMS) array. A PCMS device may also be referred to as a "phase change memory with selector" device. For an embodiment, a phase change memory switch device, such as PCMS 100, may be implemented as a cross-point memory array. In an embodiment of a PCMS cross-point array, a plurality of approximately orthogonally directed electrically conductive lines, referred to as "electrodes", may be formed in two or more materials, with one subset of orthogonally directed electrodes in a material positioned below an array of storage components and another subset of orthogonally directed electrodes in a material positioned above the array of storage components. As used herein, the term "cross-point memory array" refers to a memory array having two or more approximately orthogonally directed sets of electrodes. For example, as depicted in FIG. 1, an example embodiment of a cross-point memory array may comprise one set of electrodes, such as electrodes depicted in electrode material 110, positioned along a direction approximately orthogonal to a direction of another set of electrodes, such as electrodes depicted in electrode material 140.

An electrically conductive component, such as an "electrode", refers to component that may be utilized to route signals and/or supply voltages within a metal material and/or within a memory array. An electrically conductive component, such as an electrode, may comprise a sufficiently electrically conductive material, such as polysilicon, carbon, and/or metallic material, such as tungsten, titanium nitride, and/or titanium aluminum nitride, for example, for use in a memory device. Of course, claimed subject matter is not limited in scope in these respects. Other materials may, of course, also be used in an embodiment.

In an embodiment, an electrode material, such as electrode material 140, may be formed above one or more materials, such as material 150, comprising one or more semiconductor materials and/or one or more metal materials. An electrode material, such as electrode material 110, may be positioned above a selector material, such as material 120, and/or a storage component material, such as material 130, in an embodiment. Semiconductor and metal material 150 may, for example, comprise one or more decoder circuits, such as one or more data/sense lines, for example a bit-line, decoder circuits and/or one or more access lines, for example a word-line, decoder circuits, in an embodiment. Semiconductor and metal material 150 may further comprise, in an embodiment, one or more metal materials comprising electrodes utilized to route signals and/or supply voltages to electrode material 140 and/or electrode material 110, in an embodiment. For example, semiconductor and metal material 150 may comprise electrically conductive interconnect that may electrically couple a decoder circuit to an electrode in electrode material 140, although claimed subject matter is not limited in this respect.

In an embodiment, electrically conductive electrodes of electrode material 140 may lie along a direction approximately orthogonal to a direction of electrically conductive electrodes of electrode material 110, as described in more detail below. Also, in an embodiment, and as depicted in FIG. 1, a material of storage components, such as storage component material 130, and/or a selector material, such as selector material 120, may be formed and/or positioned between two or more electrode materials, such as electrode material 140 and/or electrode material 110, in an embodiment.

Also, in an example embodiment, one or more decks of memory may be formed. For example, memory device 100 may comprise a one-deck memory array. Other embodiments may comprise a greater amount of decks. For example, other embodiments may comprise four decks, although claimed subject matter is not limited in this respect. As used herein, a "deck" of memory may comprise an array of memory cells and a plurality of electrodes. For example, a first deck may comprise a plurality of access line, for example word-line, electrodes, an array of storage components formed over and/or on a plurality of word-line electrodes, and a plurality of bit-line electrodes formed over and/or on a plurality of storage components, for example. A second deck may comprise a plurality of bit-line electrodes shared with a first deck and may further comprise an additional array of storage components positioned over and/or on a plurality of bit-line electrodes, according to an embodiment. Also, for a second deck, an additional plurality of word-line electrodes may be formed over and/or on an additional array of storage components. Of course, claimed subject matter is not limited in scope in these respects.

For a memory array, such as PCMS array 100, a storage cell may comprise a chalcogenide glass material, in an implementation. A PCMS storage cell may be configured to retain or store memory in at least two different selectable states. For example in a binary system, the states are considered either a "0" or a "1,", where a "set" state, representing a binary value of '1', for example, may correspond to a more crystalline, more conductive state for a material of a storage cell and a "reset" state, representing a binary value of '0', for example, corresponding to a more amorphous, more resistive state of a storage cell material. In other systems, at least some individual memory cells may be configured to store more than two levels or states of information. In a PCMS memory array, heat sufficient to change a phase of a storage cell may be achieved by application of a current and/or voltage pulse to the storage cell, in an implementation. Further, in one or more example implementations, cross-point memory arrays may comprise one or more technologies other than PCMS, such as resistive memory technologies and/or other types of memory, and claimed subject matter is not limited in scope in this respect.

Figure 2:
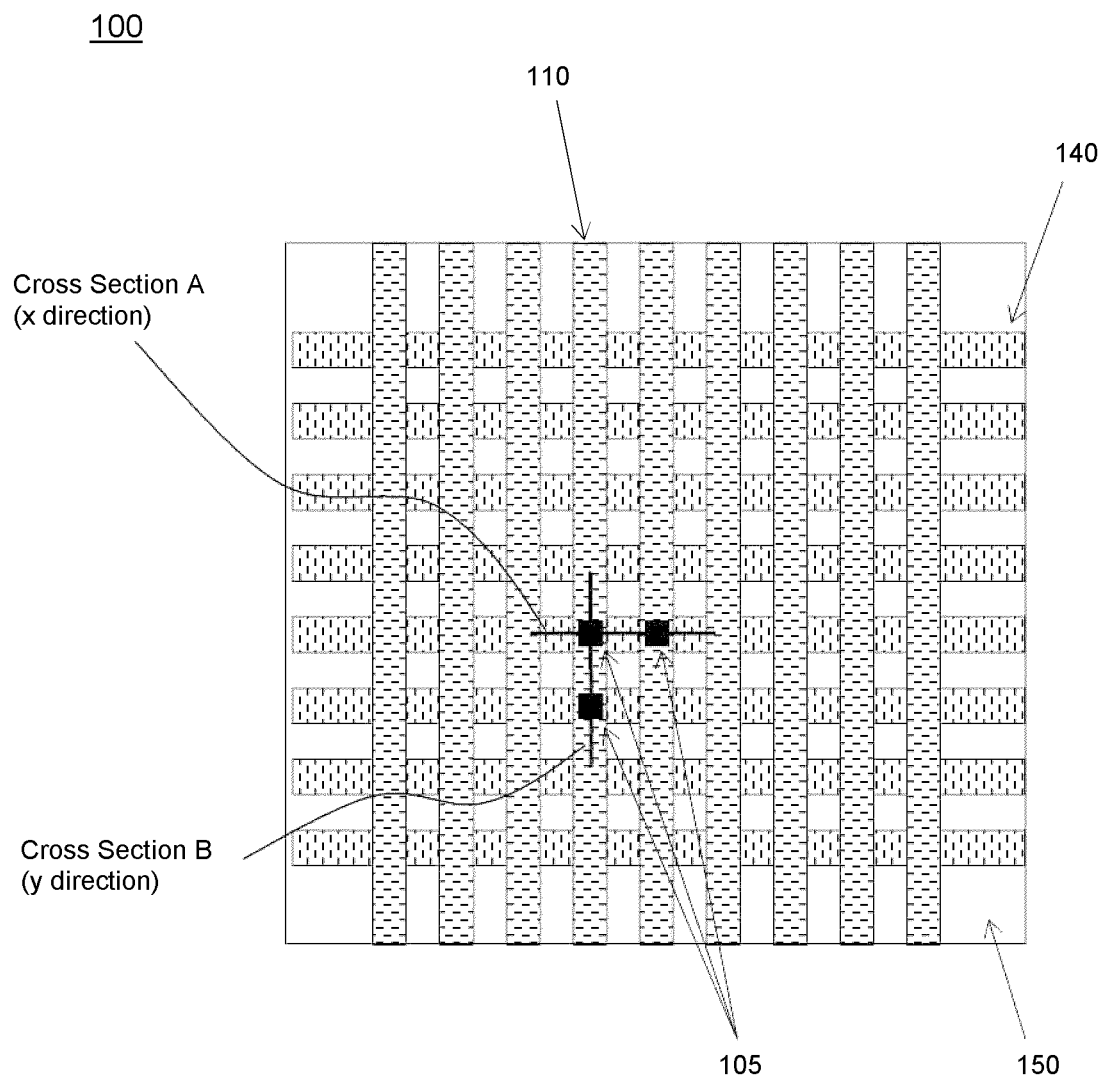
FIG. 2 is an illustration depicting a top view of a portion of a memory device, according to an embodiment.

FIG. 2 is an illustration depicting a top view of a portion of example PCMS cross-point memory array 100. Depicted in FIG. 2 is an electrode material 110 comprising a plurality of electrically conductive electrodes laying in a direction and an electrode material 140 comprising a plurality of electrically conductive electrodes laying in a direction approximately orthogonal to the direction of electrode material 110. FIG. 2 additionally shows cross-sectional line segments 'A', and 'B' that correspond to cross sectional views A and B. In an embodiment, a storage component 105 of PCMS array 100, located between electrode materials 110 and/or 140, may be selected and/or accessed in part by energizing appropriate electrodes in electrode material 140 and/or electrode material 110. For an example, PCMS cross-point memory array, such as array 100, one or more driver circuits, such as one or more word-line driver circuits and/or one or more bit-line driver circuits, may transmit one or more signals, such as one or more word-line select signals and/or one or more bit-line select signals, to one or more electrodes of electrode material 110 and/or electrode material 140. In an embodiment, electrode material 140 may comprise a plurality of word-line electrodes, for example. Also, in an embodiment, electrode material 110 may comprise a plurality of bit-line electrodes, although claimed subject matter is not limited in these respects. By transmitting a word-line select signal to a word-line electrode of electrode material 140 and/or by transmitting a bit-select signal to a bit-line electrode of electrode material 110 a particular storage cell within array 100 may be selected, for example.

In one or more embodiments, it may be advantageous to provide higher density storage arrays, for example, while also providing reduced storage component programming current. It may further be advantageous to provide higher density storage arrays and/or reduced storage component programming current without significantly increasing cost and/or difficulty of manufacture, for example. Of course, claimed subject matter is not limited in these respects. These are merely non-limiting examples.

As mentioned previously, an example process for forming one or more storage components in a phase change with selector (PCMS) memory array may comprise depositing storage component material over and/or on one or more trenches in a dielectric material to decrease die size. One or more trenches may be formed in an area above a plurality of rows individually comprising an electrode and a selector such that bottom portions a storage component may contact an electrode positioned between a storage component and a selector, in an implementation. An example process may further comprise forming a trench in a material of the memory array to affect a size of the storage components at least in part through a lithographic operation utilizing a reduced pitch mask. Individual storage components may comprise an "L" shape, wherein an approximately vertical portion of an "L" shape comprises an aspect ratio at least partially affected by a thickness of a deposition of storage component material on an approximately vertical wall of a trench in one dimension and by an additional trench formed in an approximately orthogonal direction using a reduced pitch photolithographic mask in another dimension. A reduced aspect ratio, for example, may allow for a reduction in programming current. Also in an example implementation, a horizontal potion of the "L" shaped storage component, hereafter called lower leg of an "L" shape, for an individual storage component may contact an electrode positioned between a storage component and a selector. A lower leg of an "L" shaped storage component may provide increased contact area with an electrode, providing an improved electrical connection with reduced resistance and further help increase yield during manufacturing. In one or more example implementations, an increased contact area between a storage component and an electrode may be provided while still providing a reduced aspect ratio storage component. However, claimed subject matter is not limited in scope in these respects.

Figure 3A:
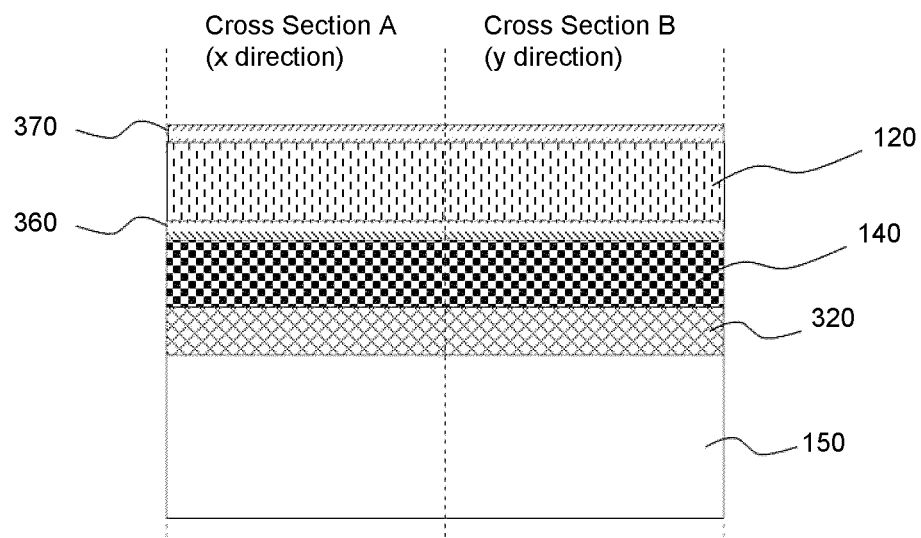
FIG. 3a is an illustration depicting a cross-sectional view of a portion of an example technique for forming storage components in a cross-point memory array, according to an embodiment.

FIGS. 3a through 3k illustrate a process of forming PCMS 100 in accordance with an embodiment of the present technology. Referring to FIG. 3a, Cross Section A depicts a cross-sectional view of a portion of PCMS array 100 looking in an 'x' direction, and Cross Section B depicts a cross-sectional view of a portion of PCMS array 100 looking in a 'y' direction that is approximately orthogonal to an 'x' direction. FIGS. 3a through 3k depict an example technique for forming at least some aspects of PCMS array 100. Of course, claimed subject matter is not limited in scope to the particular examples described herein and as depicted in FIGS. 3a through 3k.

As illustrated in FIG. 3a, a dielectric material, such as nitride 320, may be formed by deposition and/or other known processes over and/or on semiconductor and metal material 150, in an embodiment. Also in an embodiment, a material, such as tungsten, may be deposited or otherwise formed by known methods over and/or on a dielectric, such as a nitride, to produce an electrode 140. Electrode 140 may further comprise, for example, platinum, carbon, titanium nitride, and/or titanium aluminum nitride, among others, in an embodiment. Nitride 320 may comprise, for example, silicon nitride and/or silicon oxynitride, in an embodiment. Embodiments are not limited to a particular type of dielectric material or electrode material. Note that at this point in an example process electrode 140, may comprise a deposited sheet of material, and so may not yet comprise individual electrodes. In an implementation, electrode 140 may eventually comprise one or more electrodes approximately in parallel and approximately along an 'x' direction.

Further, in an embodiment, a lower electrode 360 may be formed by deposition or other known processes over and/or on PCMS array 100. In an embodiment, lower electrode 360, may comprise carbon, titanium nitride, and/or titanium aluminum nitride, among others, for example. A middle electrode 370 may also comprise carbon, titanium nitride, and/or titanium aluminum nitride, among others, for example. Additionally, a selector material 120, may be formed by deposition or other known processes, over and/or on lower electrode 360. In an embodiment, selector material 120 may comprise a chalcogenide material. However, in an embodiment, selector 120 may comprise a different chalcogenide material than that utilized for storage component material 340.

Figure 3B:
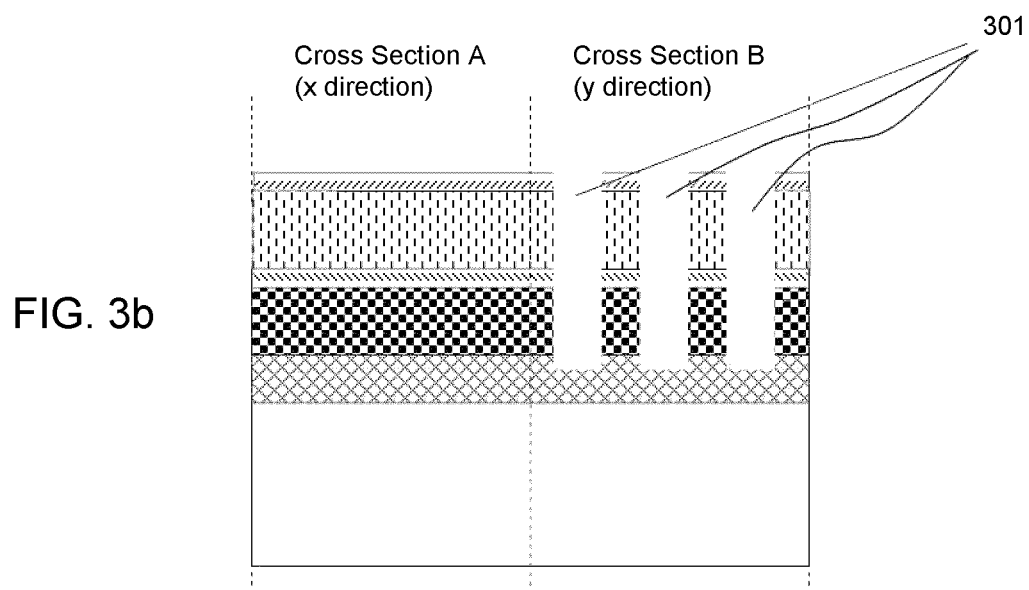
FIG. 3b is an illustration depicting a cross-sectional view of an additional portion of an example technique for forming storage components in a cross-point memory array, according to an embodiment.

FIG. 3b shows a subsequent stage of the process following the process described in FIG. 3a. As illustrated in FIG. 3b, one or more trenches 301 may be formed by etching and/or other known processes in PCMS array 100. In an embodiment, an etching process may stop approximately at dielectric material 320, having etched through middle electrode material 370, selector material 120, lower electrode 360, and/or electrode 140, for example. In an embodiment, a photoresist etch mask may be formed utilizing a lithographic technique, for example, to substantially protect PCMS array 100 outside of areas designated for trenches 301 during an etching process, although the scope of claimed subject matter is not limited in this respect.

Figure 3C:
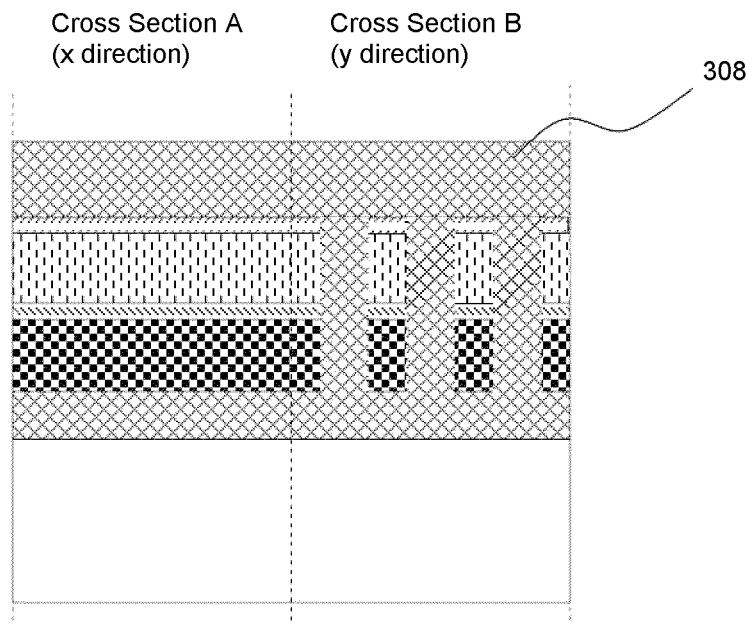
FIG. 3c is an illustration depicting a cross-sectional view of a subsequent processing step of a portion of an example technique for forming storage components in a cross-point memory array, according to an embodiment.

FIG. 3c shows a subsequent stage of the process following the process described in FIG. 3b. As illustrated in FIG. 3c, trenches 301 may be filled with a second dielectric material 308. Dielectric material 308 may be the same as dielectric 302, and/or may comprise some other dielectric material, for example. In an embodiment, Dielectric material may comprise silicon nitride and/or silicon oxynitride, for example, although other materials are also possible in other embodiments.

Figure 3D:
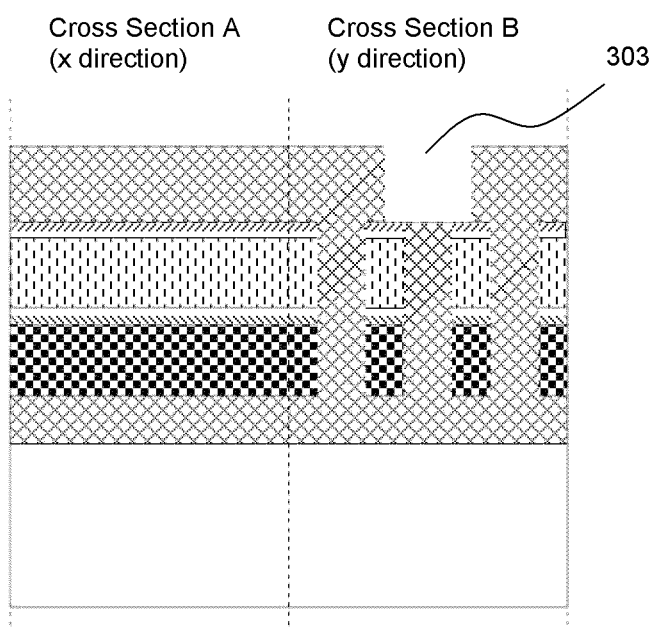
FIG. 3d is an illustration depicting a cross-sectional view of a subsequent processing step of a portion of an example technique for forming storage components in a cross-point memory array, according to an embodiment.

As further illustrated in FIG. 3d, a trench 303 may be formed by etching dielectric material 308. In an embodiment, an example etching process may stop at middle electrode material 370. A mask may be formed by known processes to substantially protect PCMS array 100 outside of the area intended for trench 303. In an embodiment, an etching process may form approximately vertical walls of trench As used herein, the term "wall" as it relates to a trench refers to an approximately vertical boundary of a trench formed, for example, by an etching process.

Figure 3E:
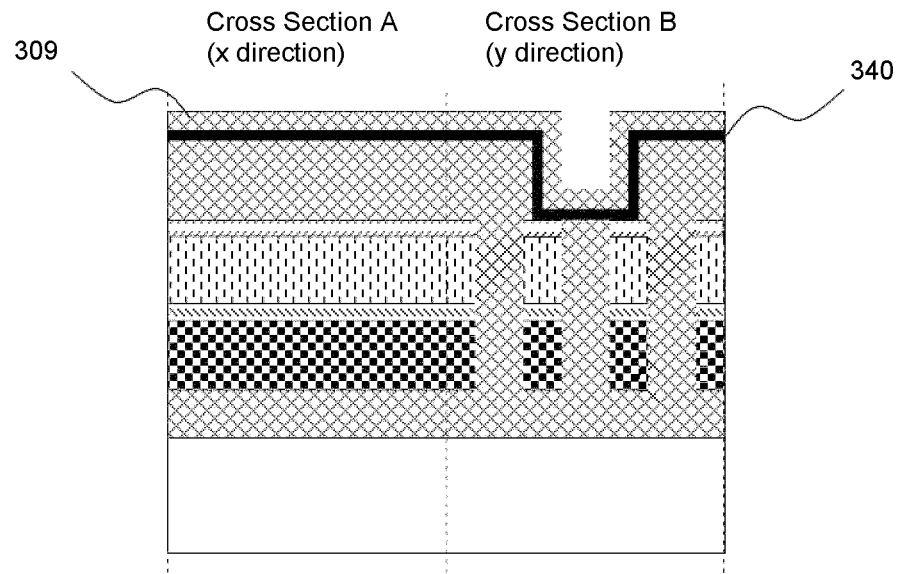
FIG. 3e is an illustration depicting a cross-sectional view of a subsequent processing step of a portion of an example technique for forming storage components in a cross-point memory array, according to an embodiment.

FIG. 3e shows a subsequent stage of the process following the process described in FIG. 3d. As depicted in FIG. 3e, a storage component material 340 may be formed over and/or on a surface of PCMS array 100, including within a trench, such as trench 303. In an embodiment, storage component material 340 may be deposited in a conformal manner. Approximately vertical sections of storage component material 340 formed on approximately vertical walls of a trench, such as trench 303, may, at least in part, be utilized to form one or more storage components, in an embodiment. Thus, an aspect ratio of a storage component may be affected in one dimension, at least in part, according to a thickness of the deposition of storage component material on the approximately vertical walls of trench 303.

Figure 3F:
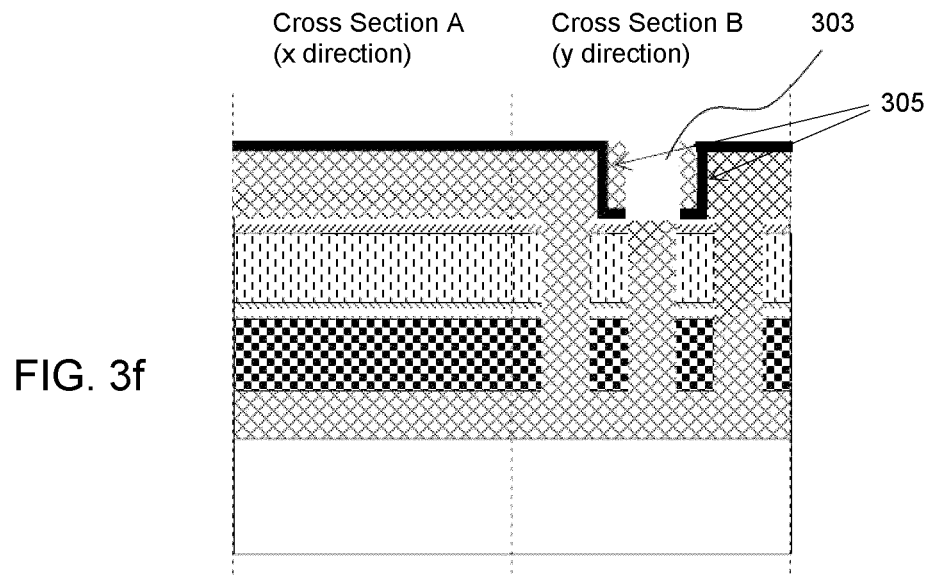
FIG. 3f is an illustration depicting a cross-sectional view of a subsequent processing step of a portion of an example technique for forming storage components in a cross-point memory array, according to an embodiment.

FIG. 3f shows a subsequent stage of the process following the process described in FIG. 3e. As illustrated in FIG. 3f, portions of dielectric material 309 positioned at a bottom surface of trench 303 may be removed, such as by a self-aligned etch of dielectric material 309. Additionally, portions of storage component material 340 positioned at a bottom surface of a trench 303, that are not substantially protected by dielectric material 309 may also be removed. The term "self-aligned etch" refers to an etching process whereby materials surrounding a region to be etched may be substantially protected from the etching process by way of an existing feature. For example, the term "self-aligned" in connection with the example etching process described in connection with FIG. 3f is meant to convey that some regions of dielectric material 309 and/or storage cell material 340 to be etched may be affected, at least in part, by dielectric material 309 deposited on the approximately vertical walls of trench 303, and/or that dielectric material 309 deposited on the approximately vertical walls of trench 303 may substantially protect underlying materials from being etched. In an example implementation, an anisotropic etch may be used. In this manner, approximately horizontal portions of memory component material 340 may remain after etching to provide lower approximately horizontal leg portions of "L"-shaped storage components 305. In an implementation, lower approximately horizontal leg portions of "L" shaped storage components 305 may provide improved contact area with middle electrode 370, potentially improving circuit reliability and/or performance.

A self-aligned etch may be performed to etch portions of memory material 340 to form, at least in part, lower approximately horizontal leg portions of storage components 305. A self-aligned etch whereby lower leg portions of storage components 305 are formed may not affect selector material 120, thereby avoiding or at least reducing the risk of significant lateral erosion of selector material 120 during etching of storage component material 340.

Additionally, a chemical/mechanical polish (CMP) process may be used to expose storage component material 340 at a top surface of PCMS 100.

Figure 3G:
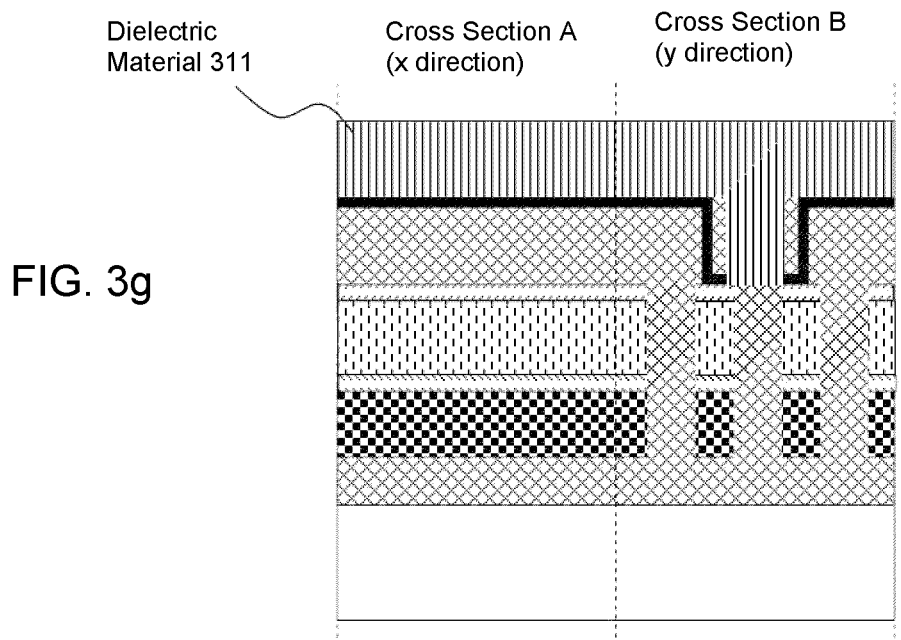
FIG. 3g is an illustration depicting a cross-sectional view of a subsequent processing step of a portion of an example technique for forming storage components in a cross-point memory array, according to an embodiment.

FIG. 3g shows a subsequent stage of the process following the process described in FIG. 3f. A dielectric material 311 may be formed over and/or on PCMS array 100, including filling trench 303. In an embodiment, dielectric material 311 may comprise silicon oxide, for example, although the scope of claimed subject matter is not limited in this respect.

Figure 3H:
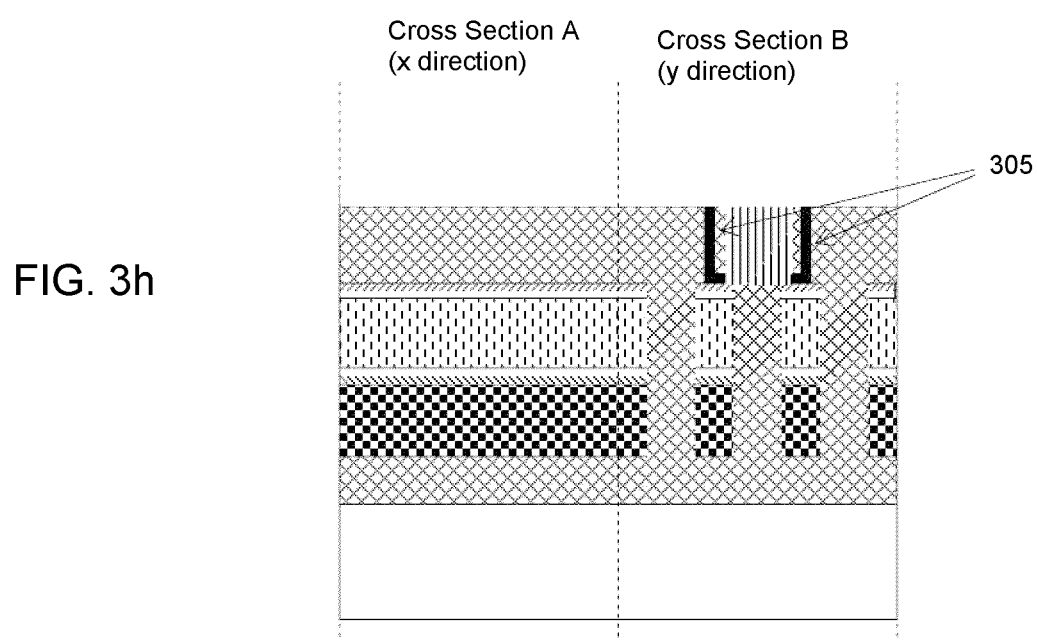
FIG. 3h is an illustration depicting a cross-sectional view of a subsequent processing step of a portion of an example technique for forming storage components in a cross-point memory array, according to an embodiment.

FIG. 3h shows a subsequent stage of the process following the process described in FIG. 3g. As depicted in FIG. 3h, array 100 may be substantially planarized to remove at least a portion of dielectric material 311 and storage component material 340 not within trench 303. Planarization may further expose a top surface of storage cells 305 at a top surface of PCMS 100. Also, the planarization process may be accomplished by chemical/mechanical polish (CMP), although claimed subject matter is not limited in scope in this respect.

Figure 3I:
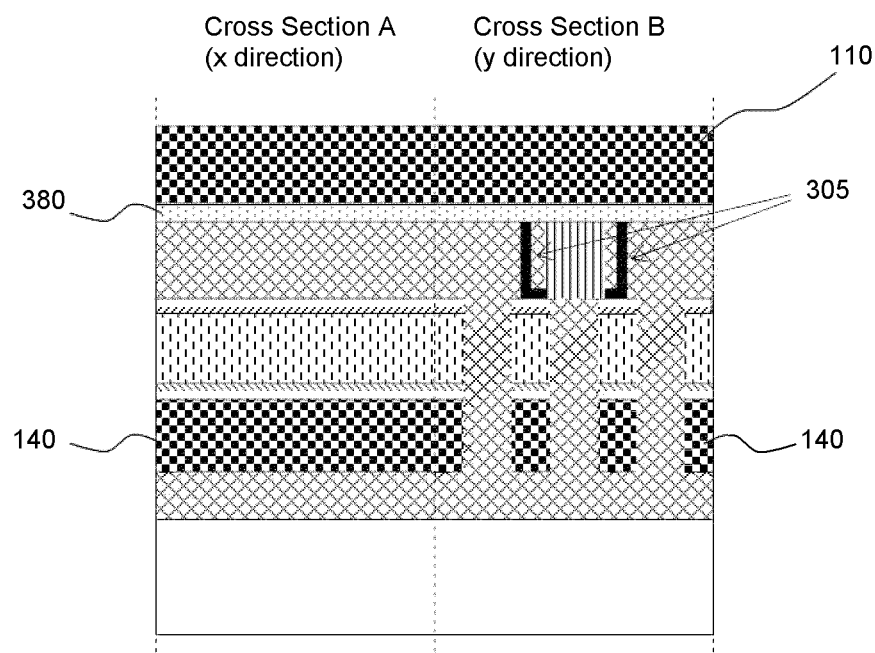
FIG. 3i is an illustration depicting a cross-sectional view of a subsequent processing step of a portion of an example technique for forming storage components in a cross-point memory array, according to an embodiment.

FIG. 3i shows a subsequent stage of the process following the process described in FIG. 3h. As illustrated at FIG. 3i, an electrode material may be formed over and/or on the substantially planarized surface of PCMS 100 to form a storage component electrode 380. Also, an electrode material such as tungsten may be formed over and/or on storage component electrode 380, thereby forming an electrode 110. In an implementation, electrode material 110 may, after patterning, comprise a plurality of electrodes along a direction that is approximately orthogonal to electrodes 140.

Figure 3J:
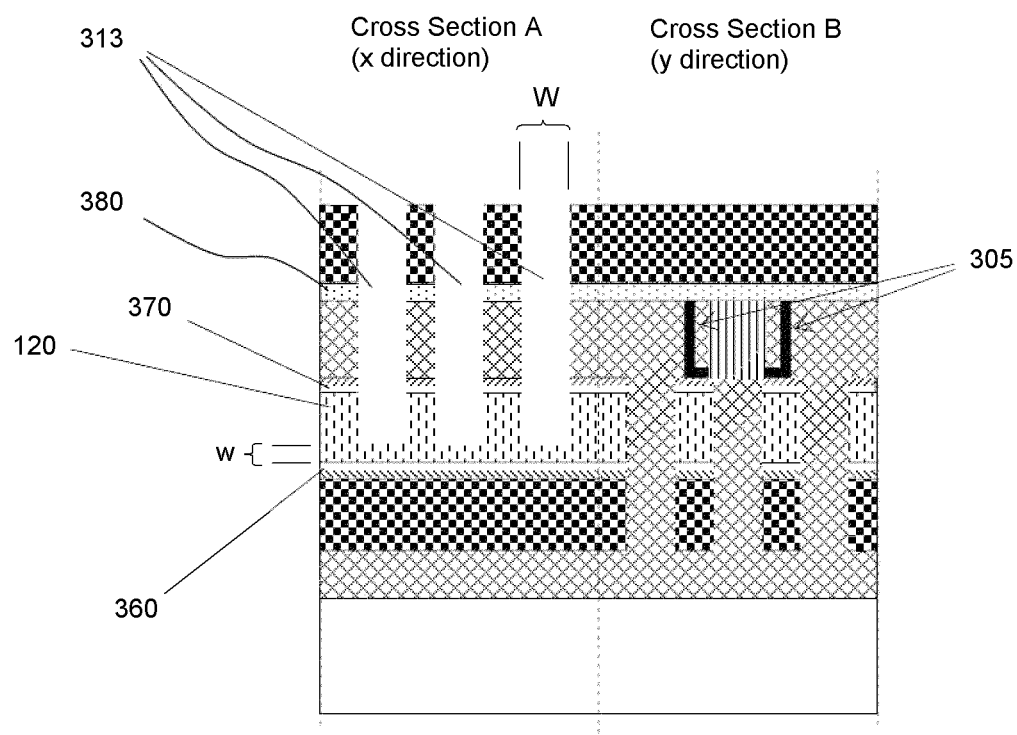
FIG. 3j is an illustration depicting a cross-sectional view of a subsequent processing step of a portion of an example technique for forming storage components in a cross-point memory array, according to an embodiment.

FIG. 3j shows a subsequent stage of the process following the process described in FIG. 3i. As depicted in FIG. 3j, a plurality of trenches 313, may be formed for example by an etch, into PCMS array 100. Trenches 313 may be positioned along a direction approximately orthogonal to trenches 301, in an example implementation. An example etching process to form trenches 313 may etch sections of electrode material 110, storage element electrode 380, dielectric material 308, and/or middle electrode 370. Additionally, selector material 120 may also be etched, at least partially, as depicted in FIG. 3j. Selector material 120 may be etched to a depth that ensures that a remaining thickness (w) of selector material at a bottom of a trench 313 is less than a distance (W) between columns of selector material 120. By ensuring that a remaining thickness of selector material 120 at the bottom of trenches 313 is less than a distance between columns, lateral switching between columns of selectors, whereby neighboring storage components may potentially inadvertently change state, may be decreased or avoided. Additionally, by not etching entirely through selector material 120, an amount of time during which storage component material 340 may be exposed to the etching process may be reduced, thereby reducing potential lateral etching of storage component material 340 and maintaining wanted thickness of material.

In an embodiment, an etching process may be accomplished utilizing a photolithographic operation. During the etch process, portions of PCMS array 100 not intended to be etched may be protected by a mask. Additionally, it may be noted that trenches, such as trenches 313, may define an additional dimension of an aspect ratio, also referred to as a cross-section, of approximately vertical portions of one or more storage components, such as storage components 305. In this manner, one dimension of an aspect ratio, or cross section, of approximately vertical portions of storage components 305 may be at least partially affected by a thickness of a deposition of storage component material on a wall of trench 303, and another dimension of an aspect ratio, or cross-section, of approximately vertical portions of storage components 305 may at least partially be affected by an example etching process utilizing a lithographic operation. However, claimed subject matter is not limited in scope in these respects.

Figure 3K:
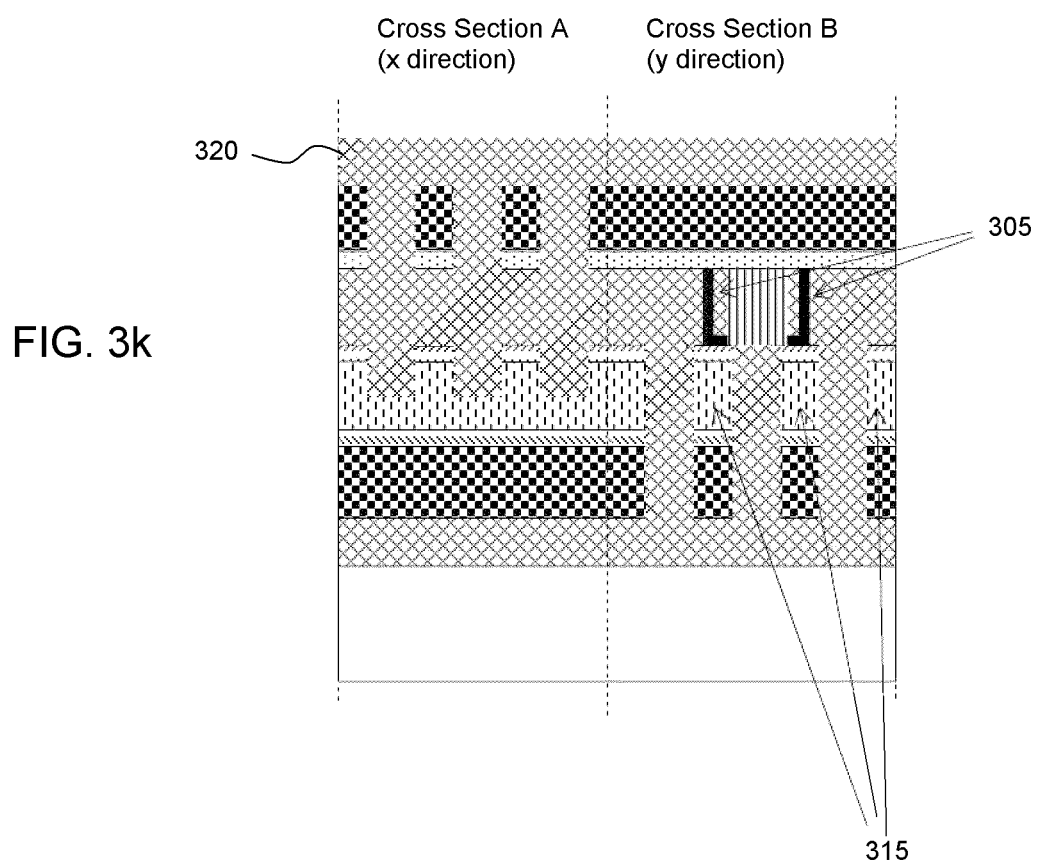
FIG. 3k is an illustration depicting a cross-sectional view of a subsequent processing step of a portion of an example technique for forming storage components in a cross-point memory array, according to an embodiment.

FIG. 3k shows a subsequent stage of the process following the process described in FIG. 3j. As illustrated in FIG. 3k, additional dielectric material, such as nitride 320, may be deposited over and/or on PCMS 100 and within trenches 313 to encapsulate storage components 305 and selectors 315, in an embodiment, for example. Deposition of additional dielectric material may provide structural stability, as well as electrical isolation for individual aspects of PCMS array 100. However, claimed subject matter is not limited in scope in these respects.

Figure 4:
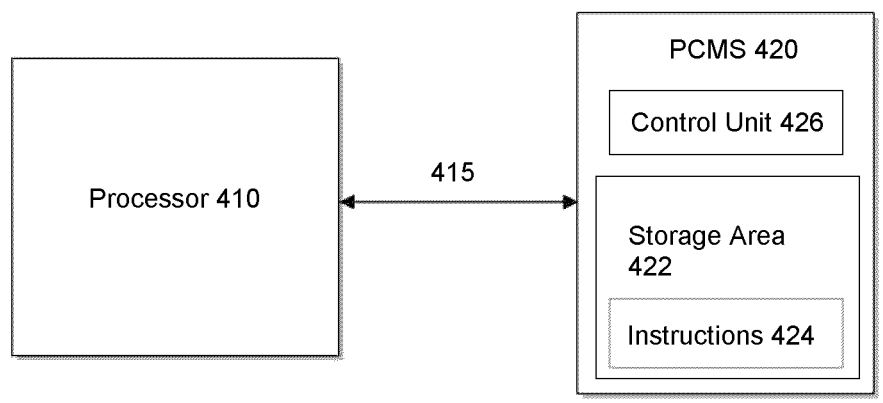
FIG. 4 is a schematic block diagram depicting a system including a cross-point array memory device, according to an embodiment.

FIG. 4 is a schematic block diagram depicting an example system 400 including an example PCMS 420. In an embodiment, PCMS 420 may comprise a storage area 422 including a PCMS cross-point memory array, such as in accordance with one or more examples. PCMS 420 may, in an example embodiment, be coupled to a processor 410 by way of an interconnect 415.

PCMS 420 in an embodiment may comprise a control unit 426. Additionally, storage area 422 may store instructions 424 that may include one or more applications that may be executed by processor 410, according with an embodiment. Processor 410 may transmit a memory access command to PCMS 420, for example. Control unit 426 may access one or more memory cells of storage area 422 at least in part in response to receiving the memory access command from processor 410, according to an embodiment. Of course, computing platform 400 is merely one example of a system implemented in accordance with claimed subject matter, and the scope of claimed subject matter is not limited in these respects.

The term "computing platform" as used herein refers to a system and/or a device that includes the ability to process and/or store data in the form of signals or states. Thus, a computing platform, in this context, may comprise hardware, software, firmware or any combination thereof (other than software per se). Computing platform 400, as depicted in FIG. 4, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, or any combination of the above. Further, unless specifically stated otherwise, a process as described herein, with reference to flow diagrams or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Methodologies described herein may be implemented by various techniques depending, at least in part, on applications according to particular features or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other devices units designed to perform the functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities.

Typically, although not necessarily, such quantities may take the form of electrical and/or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", or the like may refer to actions and/or processes of a specific apparatus, such as a special purpose computer or a similar special purpose electronic computing device. In the context of this specification, therefore, a special purpose computer and/or a similar special purpose electronic computing device is capable of manipulating and/or transforming signals, typically represented as physical electronic and/or magnetic quantities within memories, registers, and/or other information storage devices, transmission devices, and/or display devices of the special purpose computer and/or similar special purpose electronic computing device. In the context of this particular patent application, the term "specific apparatus" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change and/or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

While there has been illustrated and/or described what are presently considered to be example features, it will be understood by those skilled in the art that various other modifications may be made, and/or equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and/or equivalents thereof.

The invention claimed is:

1. A system, comprising:
   a first dielectric layer;
   a second dielectric layer;
   a memory array comprising one or more storage components that are formed over a selector layer and that at least partially enclose the first dielectric layer and the second dielectric layer; and
   a processor configured to initiate a memory access command to access the memory array.

2. The system of claim 1, wherein at least one of the one or more storage components comprise:
   a first portion in contact with a first electrode line; and
   a second portion extending from the first portion and in contact with a second electrode line.

3. The system of claim 2, wherein the selector layer is in contact with the first electrode line.

4. The system of claim 2, further comprising:
   a bit line electrode in contact with the second electrode line.

5. The system of claim 4, further comprising:
   a third electrode line in contact with a word line electrode that is orthogonal to the bit line electrode.

6. The system of claim 2, wherein the first dielectric layer is in contact with the first portion and the second dielectric layer is in contact with the second portion.

7. The system of claim 2, wherein the one or more storage components are formed within a trench in the first dielectric layer.

8. The system of claim 7, wherein the trench at least partially contacts the first electrode line.

9. The system of claim 1, further comprising:
   one or more selectors formed from the selector layer and electrically connected with an associated storage component of the one or more storage components via an associated portion of an electrode line.

10. The system of claim 9, wherein the one or more selectors comprise a different material than the one or more storage components.

11. A device, comprising:
    a first dielectric layer;

a second dielectric layer; and a storage component material formed over one or more selectors, the storage component material at least partially enclosing the first dielectric layer and the second dielectric layer.

12. The device of claim 11, wherein the storage component material comprises:

a first portion in contact with a first electrode line; and a second portion extending from the first portion and in contact with a second electrode line.

13. The device of claim 12, further comprising:

a selector of the one or more selectors and electrically connected with the storage component material via the first portion of the first electrode line.

14. The device of claim 13, further comprising:

a selector layer in which the selector of the one or more selectors is formed.

15. The device of claim 13, wherein the selector comprises a different material than the storage component material.

16. The device of claim 12, further comprising:

a bit line electrode in contact with the second electrode line.

17. The device of claim 16, further comprising:

a third electrode line in contact with a word line electrode that is orthogonal to the bit line electrode.

18. The device of claim 12, wherein the first dielectric layer is in contact with the first portion and the second dielectric layer is in contact with the second portion.

19. A device, comprising:

a first dielectric layer;

a second dielectric layer; and a storage component material formed over one or more selectors and formed within a trench in the first dielectric layer, the storage component material at least partially enclosing the first dielectric layer and the second dielectric layer.

20. The device of claim 19, wherein the storage component material comprises:

a first portion in contact with a first electrode line, wherein the trench at least partially contacts the first electrode line; and a second portion extending from the first portion and in contact with a second electrode line.

* * * * *

UNITED STATES PATENT AND TRADEMARK OFFICE
CERTIFICATE OF CORRECTION

Page 1 of 1

PATENT NO. : 11,031,553 B2
APPLICATION NO. : 16/776391
DATED : June 8, 2021
INVENTOR(S) : Pellizzer et al.

It is certified that error appears in the above-identified patent and that said Letters Patent is hereby corrected as shown below:

On the Title Page

Item (54) title, delete "CROSS REFERENCES";

In the Specification

In the title, Column 1, Line 5, delete "CROSS REFERENCES";

In the Cross-References paragraph, Column 1, Line 13, delete "Cross References";

In the Cross-References paragraph, Column 1, Line 17, delete "Cross References";

In the Cross-References paragraph, Column 1, Line 22, delete "Cross References";

In the Cross-References paragraph, Column 1, Line 26, delete "Cross References".

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*